United States Patent

Chapron

[15] 3,654,498

[45] Apr. 4, 1972

[54] SEMICONDUCTOR DEVICE HAVING AN INTEGRATED PULSE GATE CIRCUIT AND METHOD OF MANUFACTURING SAID DEVICE

[72] Inventor: Claude Chapron, Caen, France

[73] Assignee: U.S. Philips Corporation, New York, N.Y.

[22] Filed: Mar. 19, 1970

[21] Appl. No.: 21,165

[30] Foreign Application Priority Data

Mar. 24, 1969 France..................................6908560

[52] U.S. Cl. ..........................307/303, 307/256, 317/234 R, 317/235 R

[51] Int. Cl. ........................................................H01l 19/00

[58] Field of Search ..................317/234, 235; 307/256, 303, 307/213

[56] References Cited

UNITED STATES PATENTS 3,355,669 11/1967 Avins.....................................317/235

3,443,176 5/1969 Agusta et al...........................317/235

OTHER PUBLICATIONS

Custom Microcircuit Design Handbook by Fairchild Semiconductor, pages 8 and 9, March 1964

*Primary Examiner*—Jerry D. Craig
*Attorney*—Frank R. Trifari

[57] ABSTRACT

A semiconductor device having an integrated pulse gate circuit which device comprises a preferably grounded first region of a first conductivity type in which an island of the second conductivity type is provided which is preferably applied to the highest supply voltage, in which island, according to the invention, a surface zone of the first conductivity type is provided. This surface forms a plate of a capacitor which is connected on the other side to the trigger input. The surface zone is furthermore d.c. connected to the output of the pulse gate and to a resistor, the other side of which is connected to the condition input. As a result of this the drawback of the capacitance of the p-n junction between the first region and the island varying with the voltage in an undesirable sense is avoided.

7 Claims, 5 Drawing Figures

Figure 1:
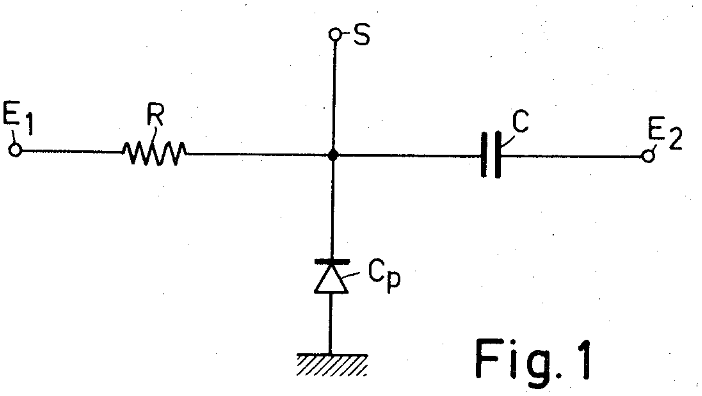

INVENTOR.
CLAUDE CHAPRON
BY
Frank R. Trifari
AGENT

CLAUDE CHAPRON
INVENTOR.
BY [signature]
AGENT

SEMICONDUCTOR DEVICE HAVING AN INTEGRATED PULSE GATE CIRCUIT AND METHOD OF MANUFACTURING SAID DEVICE

The invention relates to a semiconductor device having an integrated semiconductor circuit comprising at least one pulse gate. The invention furthermore relates to a method of manufacturing such a device.

Such semiconductor devices are known. The pulse gate comprises a capacitor, one side of which is connected to a trigger input and the second side of which is connected to the output of the pulse gate and moreover to the condition input of the pulse gate via a resistor. However, these known devices have drawbacks, particularly when they are brought in to the form of integrated circuits.

It is known that p-n junctions which are biased in the reverse direction behave as if they comprise a parallel capacitance the value of which decreases when the voltage across the p-n junction increases.

It is also known that such parallel capacitances across the insulation p-n junctions of an island in an integrated circuit often adversely influence the functioning of the device in question either by absorption of charge carriers or by the formation of a potentiometer in combination with other capacitors present in the circuit. In the case in which a pulse gate as described above is present in an integrated circuit, a stray capacitance is present between the output of the pulse gate and the substrate which usually is connected to ground.

The disadvantageous effect of said capacitance is often intensified by the variation of its value with the voltage across it. The consequences of this variation are particularly undesirable in certain cases in which it would be desirable that, when the voltage across said capacitor is increased, an increase of the capacitance should occur. This is the case notably in integrated circuits in which a pulse gate is incorporated.

It is the object of the invention to avoid or at least considerably mitigate the above-mentioned drawbacks of known integrated pulse gate circuits.

The invention is based on the recognition of the fact that, when a voltage varies in a given direction, it is possible to find a fixed reference potential in such manner that the difference between said reference potential and the variable voltage varies in the opposite direction.

In connection herewith a semiconductor device of the type mentioned in the preamble is characterized according to the invention in that the device comprises a semiconductor body having a surface which is at least partly covered with an insulating layer and having a first region of a first conductivity type adjoining said surface and comprising a connection conductor, an island-shaped region of the second conductivity type adjoining the surface and entirely surrounded by the first region within the body and forming a first p-n junction therewith, said island-shaped region comprising a connection conductor, a surface zone of the first conductivity type which is fully surrounded by the island-shaped region within the body and forms a second p-n junction therewith, which surface zone forms one of the plates of a capacitor and comprises a connection conductor which is connected to the output of the pulse gate and is connected, via a resistor, to the condition input of the pulse gate, the other side of the capacitor being connected to the trigger input of the pulse gate via a connection conductor.

The surface zone and the island-shaped region in the device according to the invention are separated from each other by a p-n junction in back-to-back arrangement relative to the p-n junction between the island-shaped region and the first region. As a result of this the stray capacitance is replaced by a system of two series-arranged capacitors one of which, the island capacitor, in the operating condition is connected to ground on the side of the first region (the substrate side), while the other side, the island, is applied to the highest supply voltage and hence can no longer have a disturbing influence during the switching on and off of the pulse gate. The only capacitance which plays a part is that between the surface zone and the island-shaped region; in the device according to the invention it plays the part of the already mentioned stray capacitance, potentiometer, and so on. Across this capacitance, there is a variable voltage set up which in this case is formed by the voltage difference between a fixed comparatively high reference potential and the voltage applied across the pulse gate, that is, between the surface zone and the first region. In contrast with the described known integrated pulse gate circuit, however, this variable voltage across the capacity does not vary in the same direction as the said applied voltage but in the opposite direction. As a result of this the capacitance between the surface zone and the island-shaped region reaches its maximum and its minimum values at favorable instants.

According to an important preferred embodiment the dielectric of the said capacitor partly formed by the surface zone is formed by the insulating layer, the second capacitor plate being formed by a conductive layer, preferably a metal layer, situated on the insulating layer above the surface zone of the first conductivity type which layer is connected to the trigger input of the pulse gate. During operation of the device the connection conductor of the island-shaped region, as already described, is preferably connected to the highest supply voltage, the connection conductor of the first region being preferably connected to ground.

According to a further preferred embodiment the said resistor is formed by a second surface zone of the first conductivity type which within the body is fully surrounded by a second island-shaped region of the second conductivity type which is fully surrounded by the said first region. If desirable, however, the resistor may also be formed differently, for example, by a resistance layer situated on the insulating layer, by another integrated construction, for example, a buried resistor, and so on.

According to another preferred embodiment the device according to the invention is characterized in that the island-shaped zones form parts of an epitaxial layer of the second conductivity type situated on the first region and are bounded by diffused separation zones of the first conductivity type which extend from the surface throughout the thickness of the epitaxial layer.

The island-shaped regions and the surface zones present may also advantageously be formed by zones diffused in the semiconductor body.

According to another preferred embodiment the connection conductors provided on the island-shaped regions and the surface zones are at least partly formed by metal layers which are provided on the insulating layer and which adjoin the semiconductor body via a contact window in the insulating layer.

The invention furthermore relates to a method of manufacturing a device according to the invention in which in a first region of the first conductivity type the island-shaped regions and the surface zones are provided, after which the semiconductor body is provided with connection conductors, which method is characterized in that the island-shaped regions and/or the surface zones are simultaneously provided in the body. When the island-shaped zones as described above are formed by parts of an epitaxial layer, the first and the second surface zones and the separation zones can advantageously be provided simultaneously in the body.

Figure 2:
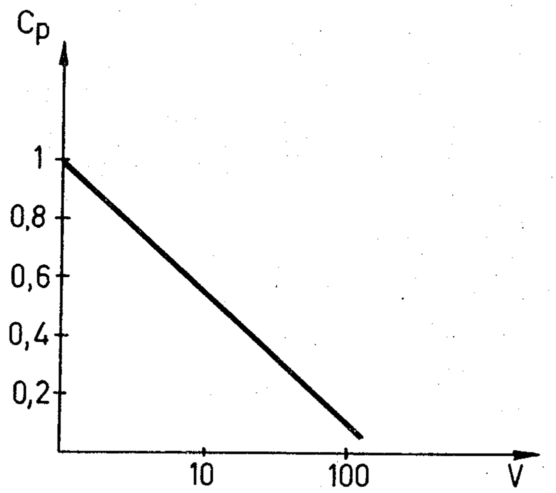
Figure 3:
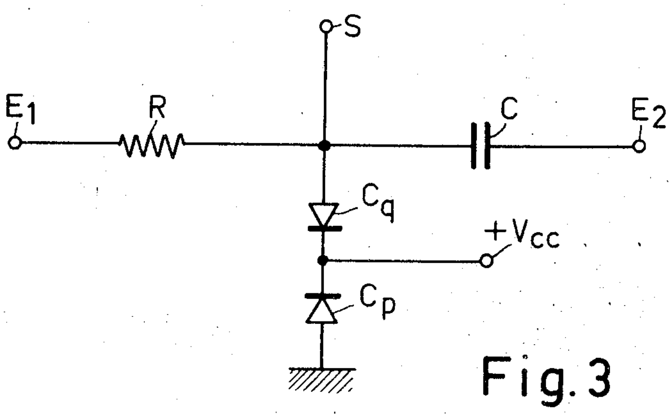
Figure 4:
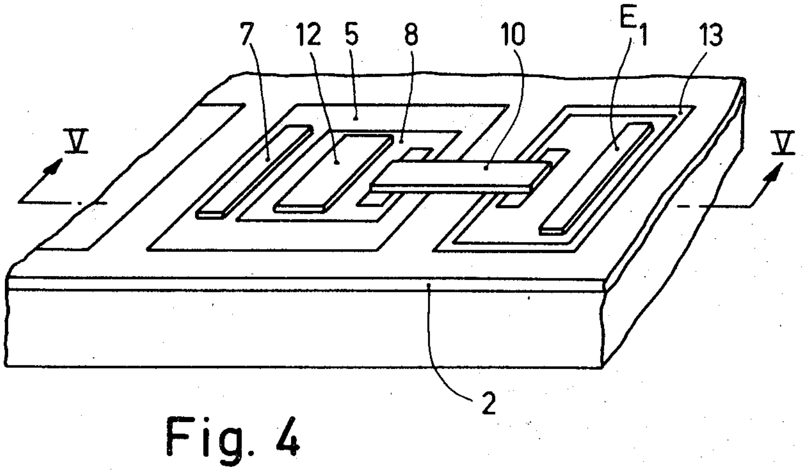
Figure 5:
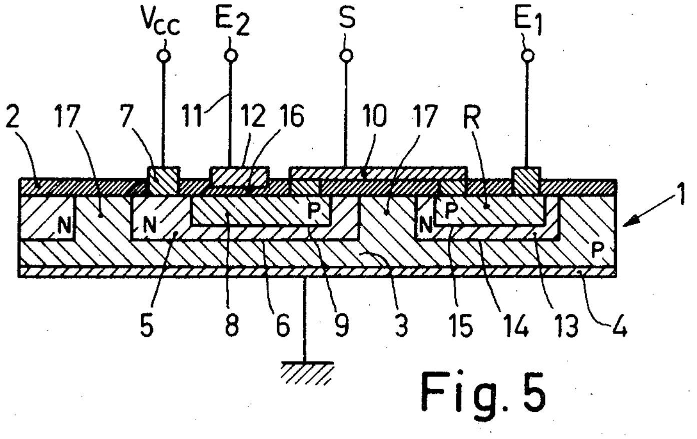

In order that the invention may be readily carried into effect, one embodiment thereof will now be described in greater detail, by way of example, with reference to the accompanying drawing, in which FIG. 1 is the electric circuit diagram of a known pulse gate circuit, FIG. 2 shows on a semi-logarithmic scale the variation of the capacity of a p-n junction as a function of the cut-off voltage across the junction, FIG. 3 is the electric equivalent circuit diagram of an integrated circuit having a pulse gate according to the invention, FIG. 4 is a diagrammatic perspective view of an integrated construction of the circuit shown in FIG. 3, and FIG. 5 is a diagrammatic cross-sectional view taken on the line V—V of the device shown in FIG. 4.

For clarity, the figures are diagrammatic and not drawn to scale while like components in the figures are referred to by like reference numerals.

The known pulse gate the circuit of which is shown in FIG. 1, switches on when the two inputs, the condition input and the trigger input, simultaneously have a potential suitable for that purpose, while the pulse gate switches off, or does not switch on, in all the other cases. The pulse gate comprises a capacitor C the first plate of which forms the trigger input $E_2$ and a resistor R one end of which forms the condition input $E_1$ while the second plate of the capacitor and the other end of the resistor are connected together and also to the output S.

The condition input $E_1$ can assume two potentials, one potential at high level $V_{1h}$ and one potential at low level $V_{1b}$. Voltage pulses having an amplitude $V_2$ are applied to the trigger input $E_2$. When the two voltage levels of the condition input are positive relative to ground, the negative pulse edge is operative, and conversely. The following description is given for the case in which the operative pulse edge is the negative edge; the operation in the opposite case can be derived therefrom as such by reversing the conductivity types and the polarity voltages.

In principle the condition for switching on or off is given by a limit voltage $V_o$, i.e. in the case of negatively operative pulse edge:

$$V_{1b} + V_2 < V_o \quad (1)$$

In practice the voltage sources used are not quite constant and the applied voltages may vary slightly per source and/or with time, so that it is necessary to includes two series of values in the considerations, one series of high values $V_{1hh}$, $V_{1bh}$ and $V_{2h}$, and one series of low values $V_{1hb}$, $V_{1bb}$ and $V_{2b}$, between which values $V_{1h}$, $V_{1b}$ and $V_2$ can vary, and two limit values can be established, a high value $V_{oh}$ and a low value $V_{ob}$ one of which applies to the switching-on, the other applies to the non-switching on under the most unfavourable conditions.

For the switching-on by a negative pulse edge it holds that:

$$V_{1bh} + V_{2b} < V_{ob} \quad (2)$$

For the non-switching-in by a negative pulse edge, one has $$V_{1hb} + V_{2h} < V_{oh} \quad (3)$$

It will of course be tried to lay the two threshold values $V_{ob}$ and $V_{oh}$ as close together as possible.

The variation of the stray capacitance $C_p$ between the output and ground plays a doubly unfavourable part in this pulse gate in an integrated form. The pulse gate will switch on at the low level when the value of the stray capacitance is maximum. This stray capacitance is thereby annoying since charge carriers are absorbed by it and this to a greater extent according as said capacitance gets larger.

For switching off or not switching on, the presence of said stray capacitance is just favourable since it serves as a potentiometer. This influence will be larger according as the value of said capacitance is higher. Since the voltage across said stray capacitance is high at the instant of switching-off, the capacitance value at said instant is high and the direction in which the value of said capacitance varies contributes to the two threshold values $V_{ob}$ and $V_{oh}$ being separated from each other.

With respect to the voltage $V_2$ at the trigger input $E_2$, the stray capacitance $C_p$ in combination with the capacitor C plays the part of a potentiometer which divides said voltage $V_2$ into two parts:

$V_{21}$ across the capacitor C and $V_{22}$ across the capacitor $C_p$:

$V_2 = V_{21} + V_{22}$

The active voltage across the capacitor C hence is always smaller than the control voltage at the trigger input $E_2$. In addition, said decrease is dependent upon the voltage at the output as a result of the voltage dependence of the stray capacitance.

FIG. 2 shows the capacitance variation of $C_p$ on a semilogarithmic scale as a function of the cut-off voltage V across the p-n junction.

In the known pulse gate shown in FIG. 1, said voltage decrease is minimum in the switched-off condition when the deviation of the voltage at the output is to be decreased and it is maximum at the instant of switching on when the opposite would be desirable. Moreover, the capacitor $C_p$ absorbs charge carriers at the instant of switching-on so that the high value of $C_p$ at the said instant is a further drawback.

All this is caused by the fact that, when in said known circuit the direct voltage at the condition input $E_1$ passes from one level to the other, for example, from the low level $V_{1b}$ to the high level $V_{1h}$, the cut-off voltage across the p-n junction the variable capacitor $C_p$ of which exerts influence on the functioning of the device, also varies from the low level $V_{1b}$ to the high level $V_{1h}$.

These drawbacks are avoided in the device according the invention the equivalent circuit diagram of which is shown in FIG. 3. This device which is shown in an integrated form in FIGS. 4 and 5 comprises a p-type silicon body 1 which is covered at least partly with an insulating layer 2 of silicon oxide. This body comprises a first region 3 of p-type conductivity adjoining a surface, which region comprises a connection conductor 4 in the form of a metal layer, and an island-shaped region 5 of n-type conductivity adjoining the surface. This island-shaped region 5 is fully surrounded within the body by the first region 3 and forms therewith a first p-n junction 6. This island-shaped region 5 is connected, via a window in the insulating layer 2, to a connection conductor in the form of a metal layer 7. The device furthermore comprises a p-type surface zone 8 which within the body is fully surrounded by the island-shaped region 5 and forms a second p-n junction 9 therewith. The surface zone 8 forms one of the capacitor plates, the dielectric of said capacitor being formed by a part 16 of the oxide layer 2, the other capacitor plate being formed by a metal layer 12 situated on the oxide layer 2 above the surface zone 8. The surface zone 8 comprises a connection conductor in the form of a metal layer 10 which is DC connected to the output S of the pulse gate. The metal layer 12 is DC connected to the trigger input $E_2$ of the pulse gate.

The semiconductor body furthermore comprises a resistor in the form of a second p-type surface zone R which is fully surrounded within the body by a second island-shaped region 13 of n-type conductivity which forms a p-n junction 15 with the zone R. The island-shaped region 13 forms a p-n junction 14 with the first region 3. The connection conductor 10 adjoins the zone R via a window in the oxide layer 2, and is connected, via the resistor R, to the condition input $E_1$ of the pulse gate.

In the operating condition the connection conductor 7 of the island-shaped region 5 is connected to the highest (positive) supply voltage $V_{cc}$, a metal layer 4 which forms the connection conductor on the first region 3 being connected to ground.

The island-shaped zones 5 and 13 in this example form part of an n-type epitaxial layer situated on the first region 3 and bounded by diffused p-type separation zones 17 which extend from the surface throughout the thickness of the epitaxial layer and form part of the region 3. According to another construction of the device the island-shaped regions 5 and 13 and the surface zones 8 and R can be formed by diffusion from the surface in the originally entirely p-type conductive semiconductor body.

Since in the device according to the invention the island capacitance $C_p$ is connected to ground on one side and is connected to the high supply voltage $V_{cc}$ on the other side, said capacitance no longer has any influence on the electric behavior of the pulse gate. The variable capacitance which plays a part in this case is the capacitance $C_q$ of the p-n junction 9. When the direct voltage at the condition input $E_1$ passes from the low level $V_{1b}$ to the high level $V_{1h}$, the voltage across $C_q$ varies from $V_{cc} - V_{1b}$ to $V_{cc} - V_{1h}$, which expression varies in the opposite sense to the said voltage level. So a high value of the stray capacitance corresponds to the high level $V_{1h}$ of the condition voltage, and a low value of said capacitance corresponds to the low level $V_{1b}$ of the condition voltage which is the very object of the present invention.

It will be obvious that the invention is not restricted to the example described but that many variations are possible to these skilled in the art without departing from the scope of this invention. For example, other semiconductor materials, other insulating layers and other metal layers may be used. The capacitor formed by surface zone 8, part 16, and metal layer 12 may in certain cases also be formed differently, for example, by a cut-off p-n junction having a dielectric differing from the insulating layer 2. Furthermore, the conductivity types and the applied voltages may be reversed simultaneously while quite different geometries may be used, in which, for example the region 3 may itself be formed by an epitaxial layer provided on a substrate.

The device described can be manufactured according to methods conventionally used in semiconductor technology. Many variations are possible. According to the invention, the islands 5 and 13 and also the zones 8 and R are advantageously provided simultaneously in the body. In the present example, for example, the islands 5 and 13 are provided simultaneously in that, after growing the n-type epitaxial layer of which said islands form part, the zones 8 and R and also the p-type separation diffusions 18 (see FIG. 5) between the islands are provided in the same diffusion step. The part 16 of the oxide layer is preferably etched away locally to a thickness of a few hundred so as to obtain the desirable thickness for the capacitor C.

What is claimed is:

1. A semiconductor device having an integrated semiconductor circuit comprising at least one pulse gate, said pulse gate comprising a semiconductor body having a surface which is at least partly covered with an insulating layer and having a first region of a first conductivity type adjoining the surface, a first connection conductor conductively contacting the first region, an island-shaped region of a second conductivity type adjoining the surface and fully surrounded within the semiconductor body by the first region to form a first p-n junction therewith, a second connection conductor conductively contacting the island-shaped region, a surface zone of the first conductivity type within the semiconductor body and fully surrounded by the island-shaped region to form a second P-N junction therewith, a pair of plates forming a capacitor, said surface zone forming one plate of said capacitor, a third connection conductor making conductive contact with the surface zone to form a pulse output terminal, a resistor having one end connected to the third connection conductor, a pulse input terminal connected to the other end of the resistor, a trigger input terminal connected to the other plate of said capacitor, means to apply a potential difference between said first and second connection conductors, means to apply an input pulse signal to said pulse input terminal, and means to apply a trigger pulse signal to said trigger input terminal, said pulse output terminal providing an output pulse signal for a predetermined relationship between said potential difference, the amplitude of said input pulse signal, and the amplitude of said trigger pulse signal.

2. A semiconductor device as claimed in claim 1, wherein the dielectric of the capacitor is formed by the insulating layer, said other capacitor plate being formed by a conductive layer, situated on the insulating layer above the surface zone of the first conductivity type, said conductive layer being connected to the trigger input terminal of the pulse gate.

3. A semiconductor device as claimed in claim 1, wherein the second connection conductor is connected to a supply voltage and the first connection conductor is connected to ground.

4. A semiconductor device as claimed in claim 1, wherein the resistor is formed by a second surface zone of the first conductivity type which within the body is fully surrounded by a second island-shaped region of the second conductivity type which is fully surrounded by the first region.

5. A semiconductor device as claimed in claim 1, wherein the island-shaped zone forms part of an epitaxial layer of the second conductivity type situated on the first region and is bounded by a diffused separation zone of the first conductivity type which extends from the surface throughout the epitaxial layer.

6. A semiconductor device as claimed in claim 1, wherein the island-shaped region and the surface zone present are diffused zones in the semiconductor body.

7. A semiconductor device as claimed in claim 1, wherein the second and third connection conductors each comprise a metal layer provided on the insulating layer and adjoining the semiconductor body via contact windows in the insulating layer.

* * * * *